United States Patent
Pederson et al.

(10) Patent No.: US 7,212,361 B1
(45) Date of Patent: May 1, 2007

(54) DISK DRIVE WITH TEMPERATURE COMPENSATION OF WRITE CURRENT

(75) Inventors: Richard Pederson, Boulder, CO (US); Dale Landgren, Fort Collins, CO (US); Jerry Moline, Denver, CO (US); David Rewerts, Longmont, CO (US)

(73) Assignee: Maxtor Corporation, Longmont, CO (US)

( * ) Notice: Subject to any disclaimer, the term of this patent is extended or adjusted under 35 U.S.C. 154(b) by 353 days.

(21) Appl. No.: 10/029,478

(22) Filed: Dec. 20, 2001

Related U.S. Application Data (60) Provisional application No. 60/257,133, filed on Dec. 20, 2000.

(51) Int. Cl.
*G11B 27/36* (2006.01)

(52) U.S. Cl. .......................................... 360/31

(58) Field of Classification Search ............... 360/31, 360/46, 51, 53, 75, 66
See application file for complete search history.

(56) References Cited

U.S. PATENT DOCUMENTS

| | | | | |
|---|---|---|---|---|
| 5,384,671 A * | 1/1995 | Fisher | .......................... | 360/51 |
| 5,600,500 A * | 2/1997 | Madsen et al. | ................ | 360/46 |
| 5,978,163 A * | 11/1999 | Cunningham | ................ | 360/66 |
| 5,991,113 A * | 11/1999 | Meyer et al. | ................ | 360/75 |
| 6,064,534 A | 5/2000 | Simozato | ...................... | 360/46 |
| 6,078,455 A | 6/2000 | Enarson et al. | ................ | 360/68 |
| 6,087,798 A | 7/2000 | Ishida | ......................... | 318/696 |
| 6,088,662 A | 7/2000 | Flinsbaugh et al. | .......... | 702/132 |
| 6,101,053 A * | 8/2000 | Takahashi | ..................... | 360/46 |
| 6,124,998 A | 9/2000 | Kanegae | ...................... | 360/68 |
| 6,169,930 B1 * | 1/2001 | Blachek et al. | ............... | 360/75 |
| 6,188,531 B1 * | 2/2001 | Chang et al. | .................. | 360/46 |
| 6,194,896 B1 | 2/2001 | Takahashi et al. | ........... | 324/252 |
| 6,252,750 B1 | 6/2001 | Gill | ........................ | 360/324.11 |
| 6,262,858 B1 | 7/2001 | Sugiyama et al. | ............ | 360/66 |
| 6,266,203 B1 | 7/2001 | Street et al. | ................... | 360/69 |
| 6,449,110 B1 * | 9/2002 | DeGroat et al. | ............... | 360/46 |
| 6,501,606 B2 * | 12/2002 | Boutaghou et al. | ........... | 360/25 |
| 6,603,617 B1 * | 8/2003 | Cross | .......................... | 360/31 |
| 6,950,266 B1 * | 9/2005 | McCaslin et al. | ............. | 360/75 |
| 6,995,933 B1 * | 2/2006 | Codilian et al. | .............. | 360/46 |
| 7,023,645 B1 * | 4/2006 | Emo et al. | .................... | 360/75 |
| 2003/0072100 A1 * | 4/2003 | Lee et al. | ..................... | 360/53 |
| 2005/0146803 A1 * | 7/2005 | Kim et al. | .................... | 360/53 |

* cited by examiner

*Primary Examiner*—Andrea Wellington
*Assistant Examiner*—Glenda P. Rodriguez
(74) *Attorney, Agent, or Firm*—Myers Bigel Sibley & Sajovec PA (57) ABSTRACT

A disk drive provides temperature compensation for write current. The write current not only provides an acceptable bit error rate for data written to and read from the disk, but also prevents write induced instability in the head. Furthermore, the write current prevents excessive pole tip protrusion. As a result, the write current ensures that data is reliably stored and retrieved at a given temperature.

35 Claims, 6 Drawing Sheets

DISK DRIVE WITH TEMPERATURE COMPENSATION OF WRITE CURRENT

CROSS REFERENCE TO RELATED APPLICATIONS

This application claims priority from U.S. Application Ser. No. 60/257,133 filed Dec. 20, 2000, the disclosure of which is incorporated herein by reference in its entirety.

FIELD OF THE INVENTION

The present invention relates to adjusting the write current in a disk drive in response to changes in temperature.

BACKGROUND OF THE INVENTION

Disk drives store large amounts of digital data. The data is stored on magnetic disks in concentric tracks. The tracks are divided into servo sectors that store servo information and data sectors that store user data. A read/write head reads data from and writes data to the disk. The head includes a read element and write element that may be separate elements or a single integrated element. The head is mounted on an actuator arm assembly that moves the head radially over the disk. Accordingly, the actuator arm assembly allows the head to access different tracks on the disk. The disk is rotated by a spindle motor at high speed, allowing the head to access different data sectors within each track on the disk.

Disk drives include parameters that are dependent on temperature. For example, the write current supplied to the head to sufficiently magnetize the disk such that data is reliably encoded on the disk increases as the temperature decreases. The need for increased write current at reduced temperature results from several factors. For instance, the disk coercivity and thus the magnetic field strength required to magnetize the disk increases as the temperature decreases. In addition, the flying height of the head over the disk increases as the temperature decreases since the air density inside the disk drive increases, and larger write current is required to magnetize the disk due to the increased distance between the head and the disk.

Disk drives have attempted to use a satisfactory write current over anticipated operating temperatures, have been provided with screened heads to eliminate heads that require large write current, and have operated under restricted temperature ranges. However, as data storage densities and data transfer rates increase, disk drive tolerances for variations in written data have decreased. Therefore, a need has emerged to vary the write current in response to temperature changes.

Disk drives have varied the write current with temperature to maintain a desired track width since changes in disk coercivity and flying height result in varying track width. However, this neglects head instability and head deformation that may result from write current that is inappropriate for a given temperature.

Head instability arises from high write current and elevated temperature, thereby causing temporary or permanent inability of the head to reliably and accurately read data from the disk. In particular, the read element suffers from write induced instability due to pinning of magnetic domains and becomes insensitive to magnetic fields on the disk.

Head deformation also arises from high write current and elevated temperature. In particular, the write element suffers from pole tip protrusion and is more likely to contact with the disk. Head-disk contact can damage the head and the disk, misposition the head and cause data errors.

SUMMARY OF THE INVENTION

The present invention provides temperature compensation for write current in a disk drive. The write current not only provides an acceptable bit error rate for data written to and read from the disk, but also prevents write induced instability in the head. Furthermore, the write current prevents excessive pole tip protrusion. As a result, the write current ensures that data is reliably stored and retrieved at a given temperature.

In an embodiment, a method of compensating the write current for a temperature of the disk drive includes measuring an ambient temperature of the disk drive, providing a first write current with acceptable bit error rate at the ambient temperature by adjusting an initial write current, and then providing a second write current with acceptable stability of the head at the ambient temperature by adjusting the first write current.

The method can include measuring the ambient temperature by measuring an internal temperature of the disk drive using a temperature sensor in the disk drive and performing a calculation using the internal temperature.

The method can also include providing the first write current by writing a test sequence to the disk using the head, reading the test sequence from the disk using the head, measuring a bit error rate of the read test sequence, comparing the measured bit error rate to a threshold, and changing the write current in response to the comparison.

The method can also include providing the second write current by reading servo information from the disk using the head, and changing the write current in response to an error in the read servo information.

The method can also include providing a third write current with acceptable pole tip protrusion of the head at the ambient temperature by adjusting the second write current. The third write current can be provided by reading servo information from the disk using the head, generating a position error signal in response to the read servo information, comparing the position error signal to a threshold, and changing the write current in response to the comparison.

Additional advantages of the present invention will become readily apparent from the following discussion, particularly when taken together with the accompanying drawings.

DETAILED DESCRIPTION

Figure 1:
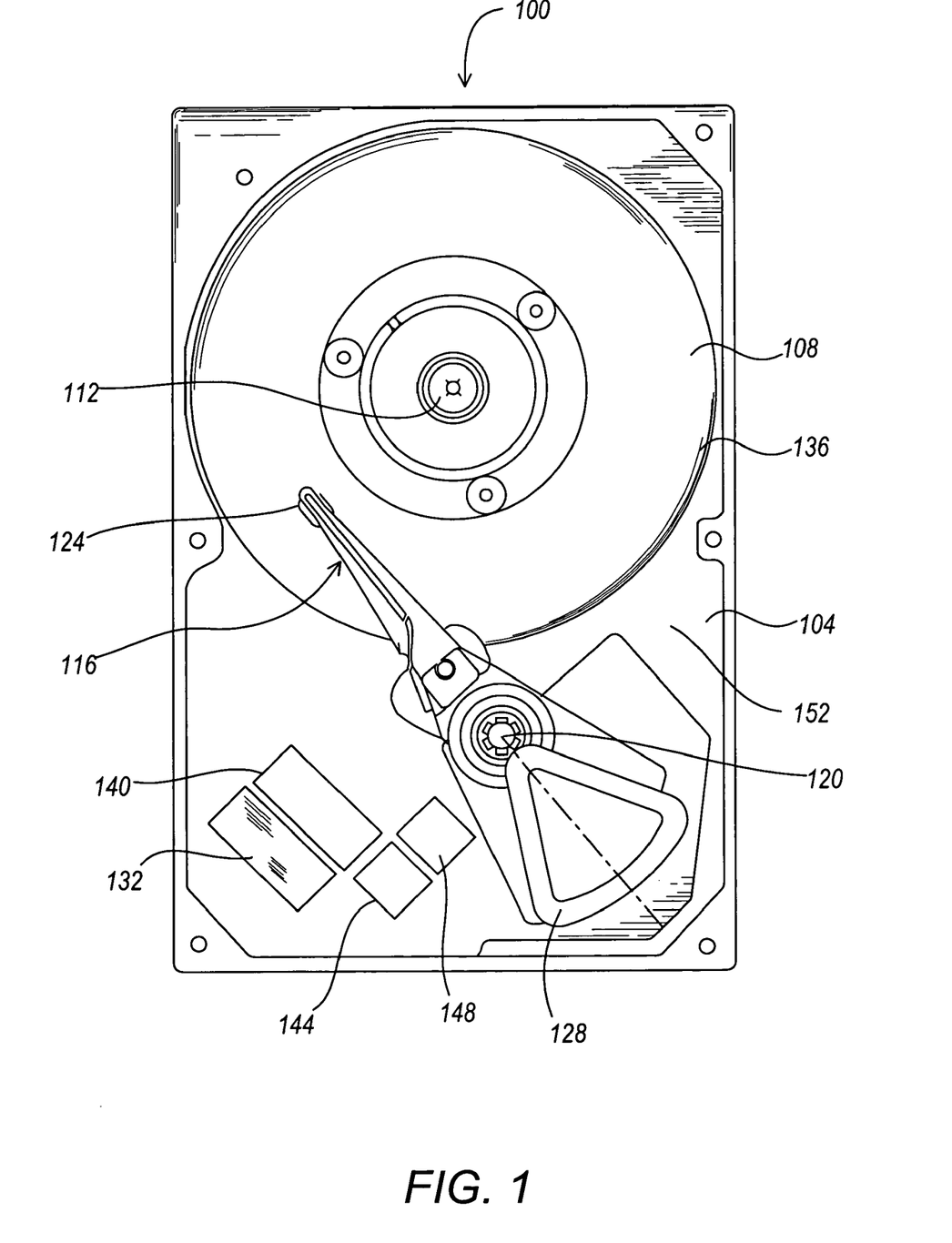
FIG. 1 is a top view of a conventional disk drive with the cover removed.

FIG. 1 illustrates a disk drive 100 that includes a base 104 and a magnetic disk (or disks) 108 (only one of which is shown). The disk 108 is connected to the base 104 by a spindle motor (not shown) mounted on or beneath a hub 112 such that the disk 108 rotates relative to the base 104. An actuator arm assembly 116 is connected to the base 104 by a bearing 120 and suspends a transducer 124 at a first end. A voice coil motor 128 pivots the actuator arm assembly 116 about the bearing 120 to radially position the transducer 124 with respect to the disk 108. The voice coil motor 128 is operated by a controller 132 that is operatively connected to a host computer (not shown). By changing the radial position of the transducer 124 with respect to the disk 108, the transducer 124 can access different tracks 136 on the disk 108. A read/write channel 140 processes data written to or read from the disk 108, and a preamplifier 144 provides write current to the transducer 124. The disk drive 100 may include a temperature sensor 148 located within a cavity 152 that encloses the disk 108 and the actuator arm assembly 116.

Figure 2:
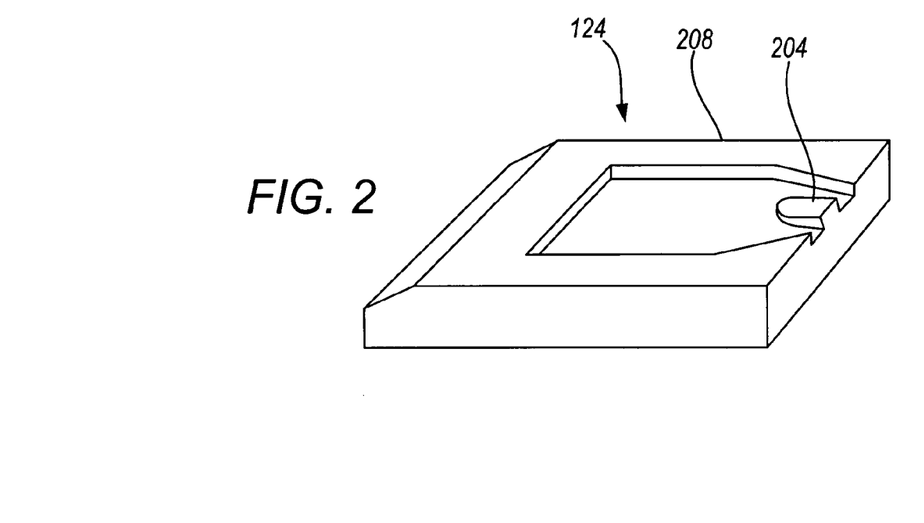
FIG. 2 is a perspective view of a transducer that includes an air bearing slider and a head.

FIG. 2 illustrates the transducer 124 in more detail. The transducer 124 includes an integrated read/write head 204 and an air bearing slider 208. The head 204 reads data from and writes data to the disk 108. The slider 208 supports the transducer 124 on a layer of air created by spinning the disk 108.

Figure 3:
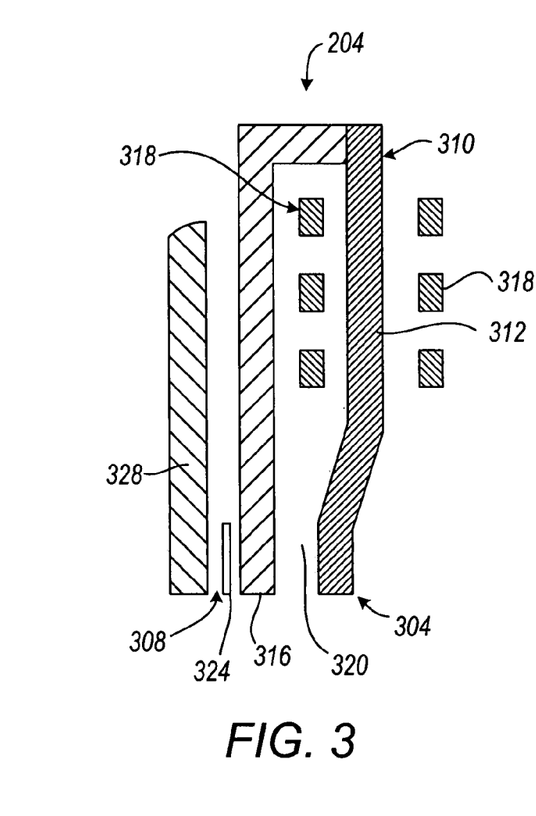
FIG. 3 is a cross section of the head that includes read and write elements.
Figure 4:
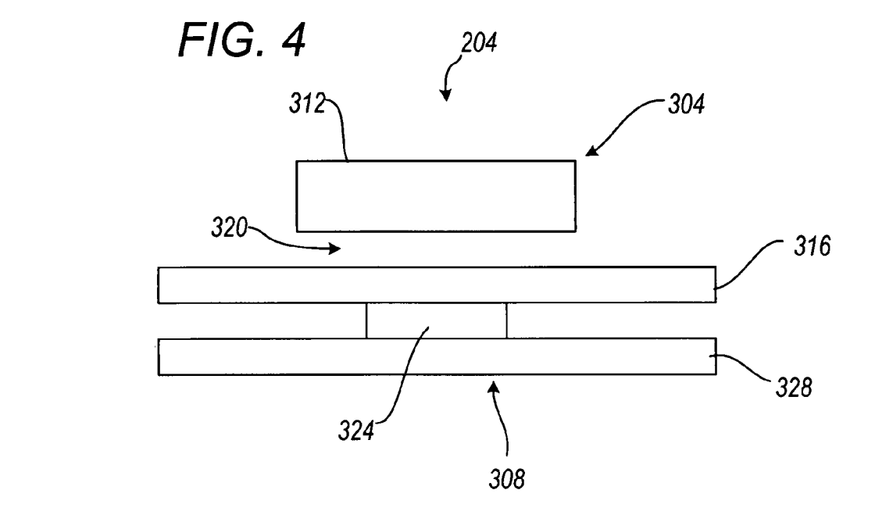
FIG. 4 is a plan view of the head.

FIG. 3 illustrates the head 204 in cross section, and FIG. 4 illustrates the head 204 in a plan view. The head 204 includes an inductive write element 304 that writes to the disk 108 and a magnetoresistive read element 308 that reads from the disk 108.

The write element 304 includes a yoke 310 of magnetically conductive material formed from a write pole 312 and a shared shield 316. A coil 318 of electrically conductive wire is wrapped about the yoke 310 and is connected to a current source (not shown). During a write operation, a write current is passed through the coil 318 to produce a magnetic field within the yoke 310. At a write gap 320 between the write pole 312 and the shared shield 316, the magnetic field spreads out because the magnetic permeability of the write gap 320 is less than that of the yoke 310. The write gap 320 is close to the disk 108, allowing the magnetic field to magnetize the disk 108 in a particular direction. A "1" is encoded on the disk 108 by reversing the direction of the write current, and a "0" is encoded on the disk 108 by the absence of a change in magnetic polarity. Of course, these conventions can be reversed.

The write current supplied to the coil 318 is generally a square wave. The write current boost of the write current is generally a write current component having a relatively high amplitude and short duration, and is timed to coincide with the leading edge of the square wave. The write current boost is of particular importance with data written at high frequencies, as the duration of the square pulse of the write current is short, and thus the write current boost makes up a large proportion of the write current. In addition, it is important to control the magnitude of the write current boost, as its relatively high amplitude can significantly heat, and thus expand, the head 304.

The write current and write current boost are varied during write operations depending on the ambient temperature of the disk drive 100. In particular, because the write current supplied to the coil 318 heats the write pole 312 and the shared shield 316, those elements and the surrounding material of the transducer 124 expand during write operations. When the expansion is large, it is know as pole tip protrusion. Pole tip protrusion increases the likelihood that the write pole 312, the shared shield 316 and other areas of the transducer 124 will contact the disk 108. In addition, when the ambient temperature of the disk drive 100 is high, the write pole 312 and the shared shield 316, together with the other portions of the head 204 are closer to the disk 108 because the flying height of the transducer 124 is lower due to the decreased air density in the disk drive 100.

The read element 308 includes the shared shield 316, a magnetoresistive strip 324 and a read shield 328. The magnetoresistive strip 324 is connected to a current source (not shown). Because the electrical resistance of the magnetoresistive strip 324 varies with the strength and direction of an applied magnetic field, the magnetic flux transitions on the disk 108 change the voltage drop across the magnetoresistive strip 324. The voltage drop changes are converted by the channel 140 into digital data for the controller 132 and in turn the host computer.

The read element 308 is sensitive to changes in the magnetic domains of the shared shield 316 which occur during write operations. Such changes can momentarily or permanently render the read element 308 ineffectual. In particular, the magnetic domains can be pinned in a particular direction, causing the read element 308 to become insensitive to the magnetic flux transitions on the disk 108. Furthermore, the magnetic domains are even easier to pin at elevated temperature. As a result, the read element 308 is susceptible to write induced instability caused by the write current, especially at elevated temperature.

Preferably, the write current is not larger than necessary to adequately write data to the disk 108, especially at elevated temperature since the read element 308 is particularly vulnerable to write induced instability.

Figure 5A:
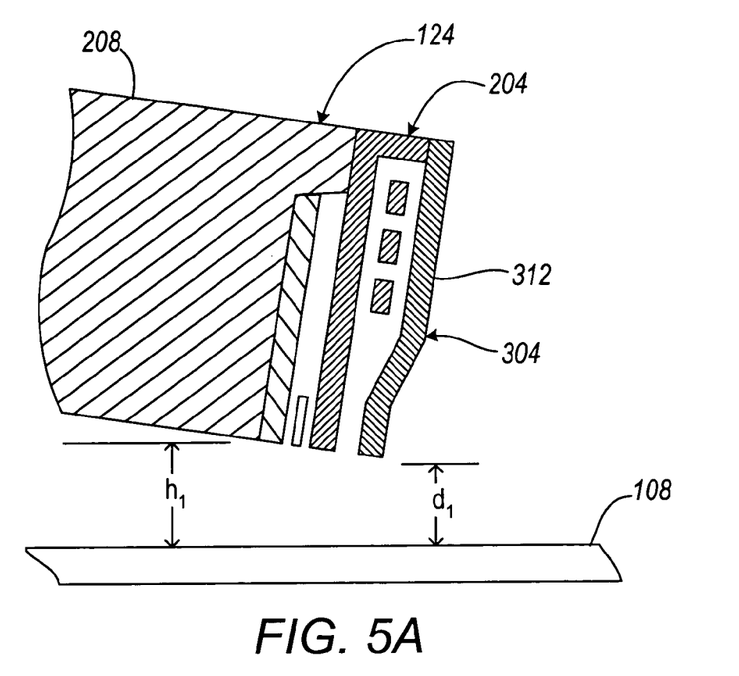
FIG. 5A shows the transducer flying over the disk at normal temperature.

FIG. 5A shows the transducer 124 flying over the disk 108 at normal temperature of the disk drive 100. The slider 208 flies over the disk 108 at a flying height $h_1$ and the tip of the write pole 312 is spaced from the disk 108 by a pole tip distance $d_1$. The flying height $h_1$ is accurately controlled to maintain the pole tip distance $d_1$ so that data is reliably written to and retrieved from the disk 108 by the head 204.

Figure 5B:
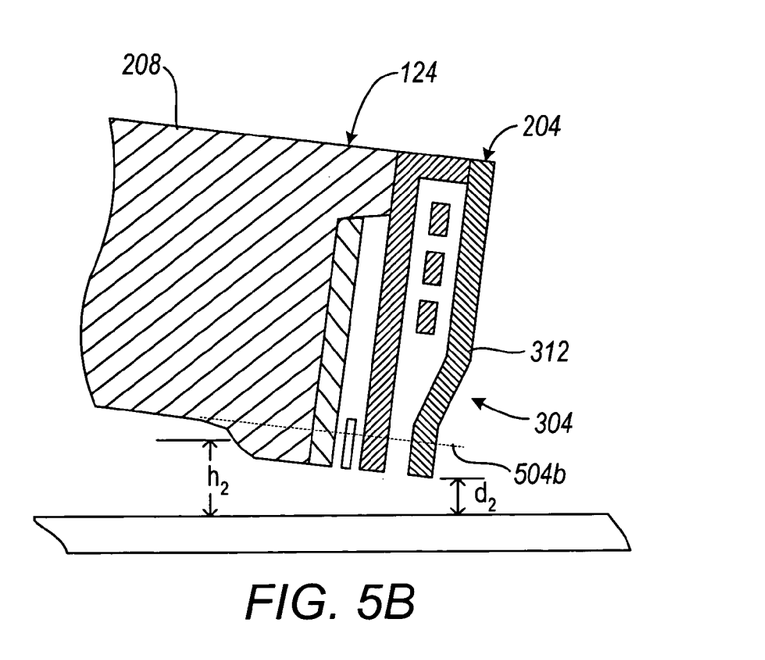
FIG. 5B shows the transducer flying over the disk at elevated temperature in accordance with the prior art.

FIG. 5B shows the transducer 124 flying over the disk 108 at elevated temperature of the disk drive 100 in accordance with the prior art. The slider 208 flies over the disk 108 at a flying height $h_2$ and the tip of the write pole 312 is spaced from the disk 108 by a pole tip distance $d_2$. The flying height $h_2$ is less than the flying height $h_1$, and the pole tip distance $d_2$ is less than the pole tip distance $d_1$. The elevated temperature decreases the air density in the disk drive 100, thereby decreasing the pressure applied to the slider 208 and in turn decreasing the flying height $h_2$ and the pole tip distance $d_2$. Furthermore, the high write current and the elevated temperature cause the head 204 and the immediately adjacent area of the slider 208 to expand beyond the normal contour of the slider 208, represented by the dotted line 504b, thereby creating pole tip protrusion and in turn further decreasing the pole tip distance $d_2$.

Figure 5C:
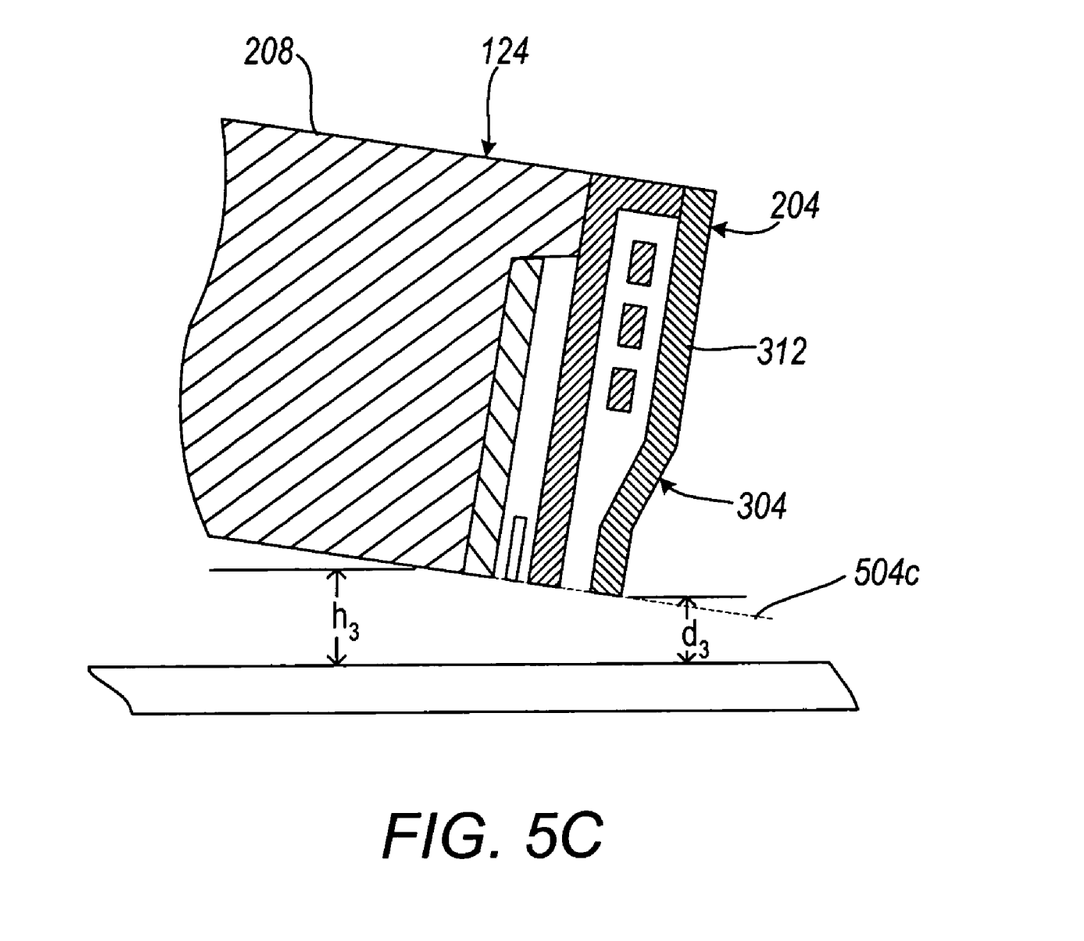
FIG. 5C shows the transducer flying over the disk at elevated temperature in accordance with the present invention.

FIG. 5C shows the transducer 124 flying over the disk 108 at elevated temperature of the disk drive 100 in accordance with the present invention. The slider 208 flies over the disk 108 at a flying height $h_3$ and the tip of the write pole 312 is spaced from the disk 108 by a pole tip distance $d_3$. The flying height $h_3$ is equal to the flying height $h_2$, however the pole tip distance $d_3$ is larger than the pole tip distance $d_2$. The elevated temperature decreases the air density in the disk drive 100, thereby decreasing the pressure applied to the slider 208 and in turn decreasing the flying height $h_3$ and the pole tip distance $d_3$, as is conventional. However, the write current is reduced to compensate for the elevated temperature so that the head 204 and the slider 208 remain within the normal contour of the slider 208, represented by the dotted line 504c, thereby avoiding pole tip protrusion and in turn avoiding further decreasing the pole tip distance $d_3$. Moreover, the reduced write current compensates for the elevated temperature to reduce or eliminate write induced instability in the read element 308.

The appropriate write current is determined by considering several factors. The write current should be large enough to produce a magnetic field that provides the desired magnetization of the disk 108 to ensure reliable retrieval of data encoded on the disk 108. However, the write current should not be large enough to produce a magnetic field produced that overwrites data in tracks adjacent to the target track. Furthermore, the write current should not be large enough to cause write induced instability or excessive pole tip protrusion.

Figure 6:
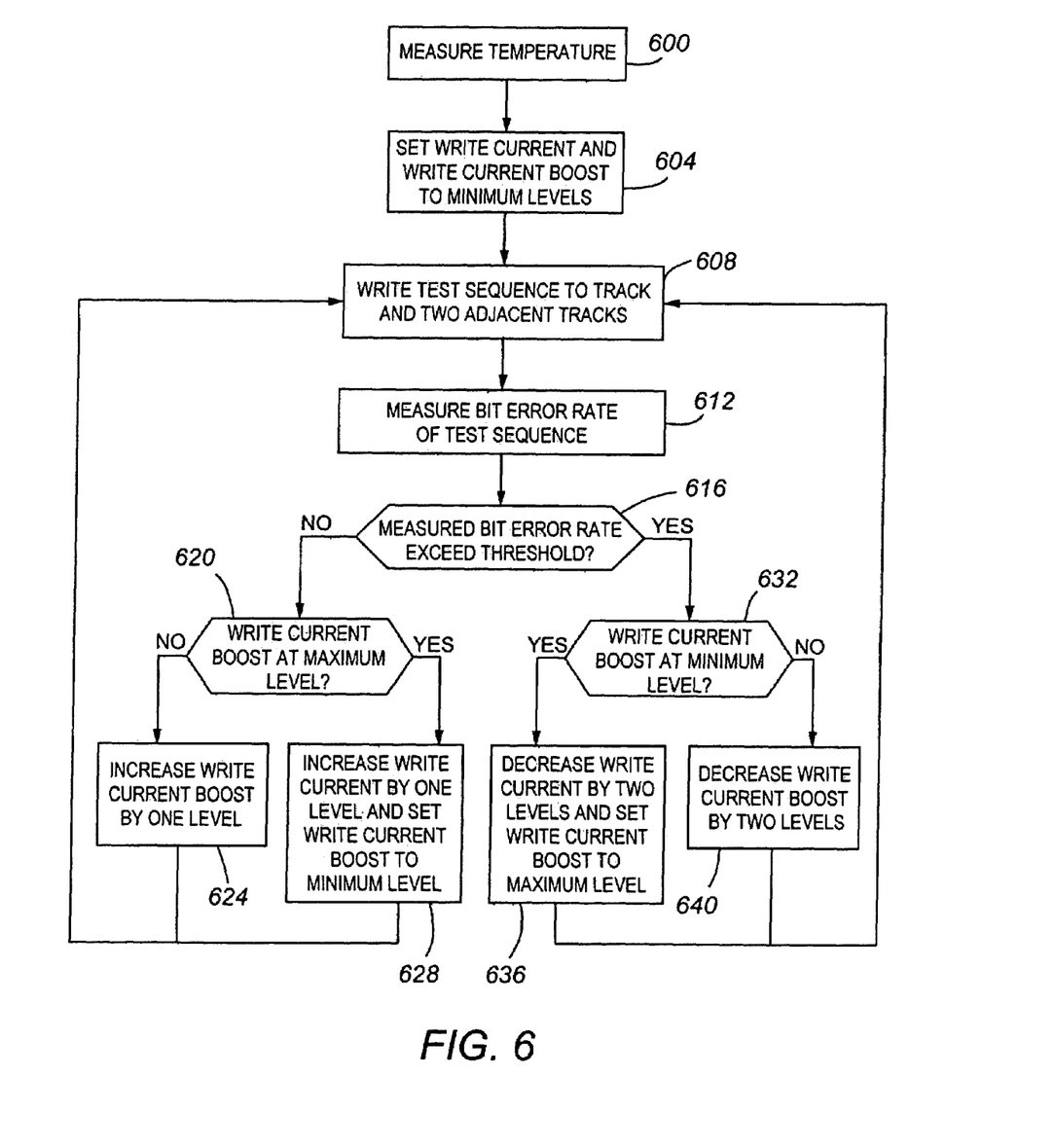
FIG. 6 is a flow chart of determining the write current based on bit error rate in accordance with the present invention.

FIG. 6 is a flow chart of determining the write current and write current boost based on bit error rate at an ambient temperature in accordance with the present invention. The flow chart determines a maximum write current and a maximum write current boost that can be supplied to the head 204 without overwriting adjacent tracks. However, the flow chart does not account for head instability or pole tip protrusion.

Initially, the ambient temperature of the disk drive 100 is measured (step 600). The ambient temperature can be measured by a temperature sensor in the cavity 152. For instance, the temperature sensor can be part of another component such as the controller 132, the channel 140 or the preamplifier 144, or a separate component such as the temperature sensor 148. Alternatively, the temperature sensor 148 can be located on an exterior surface of the disk drive 100.

The write current is set to a minimum level and the write current boost is set to a minimum level (step 604). The available write current and write current boost levels depend on the digital to analog converter (or converters) in the channel 140 or the preamplifier 144. For example, 32 different write current levels and 8 different write current boost levels are available in the preamplifier 144, and thus 256 (8×32) different write current and write current boost combinations are available.

The head 204 writes a test sequence to a center track 136 and two adjacent tracks 136 using the selected write current and write current boost (step 608). During the first iteration, the selected write current and write current boost are the initial minimum levels. The head 204 then reads the test sequence from the center track 136, and the quality of the written data is assessed by measuring the bit error rate of the read test sequence (step 612). An excessive bit error rate will result if the write current and/or write current boost is too high since writing to the adjacent tracks 136 at least partially overwrites the center track 136.

A determination is made as to whether the measured bit error rate exceeds a specified threshold (step 616). If the measured bit error rate is within the threshold, then a determination is made as to whether the write current boost is a maximum level (step 620). If the write current boost is not the maximum level, then the write current remains at its present level and the write current boost is increased by one level (step 624). If the write current boost is the maximum level, then the write current is increased by one level and the write current boost is set to the minimum level (step 628). After step 624 or 628 is performed, the process returns to step 608 and the head 204 writes the test sequence again to the center track 136 and the two adjacent tracks 136 using the increased write current or write current boost during the next iteration.

If at step 616 it is determined that the measured bit error rate exceeds the threshold, then a determination is made as to whether the write current boost is the minimum level (step 632). If the write current boost is the minimum level, then the write current is decreased by two levels and the write current boost is set to the maximum level (step 636). If the write current boost is not the minimum level, then the write current remains at its present level and the write current boost is decreased by two levels (step 640). After step 636 or 640 is performed, the process returns to step 608 and the head 204 writes the test sequence again to the center track 136 and the two adjacent tracks 136 using the decreased write current or write current boost during the next iteration.

The initial levels for the write current and write current boost at step 604 need not be the minimum levels. For example, the initial levels can be intermediate levels when the disk drive 100 is less than a maximum temperature. Furthermore, different adjustments to the levels can be used.

Figure 7:
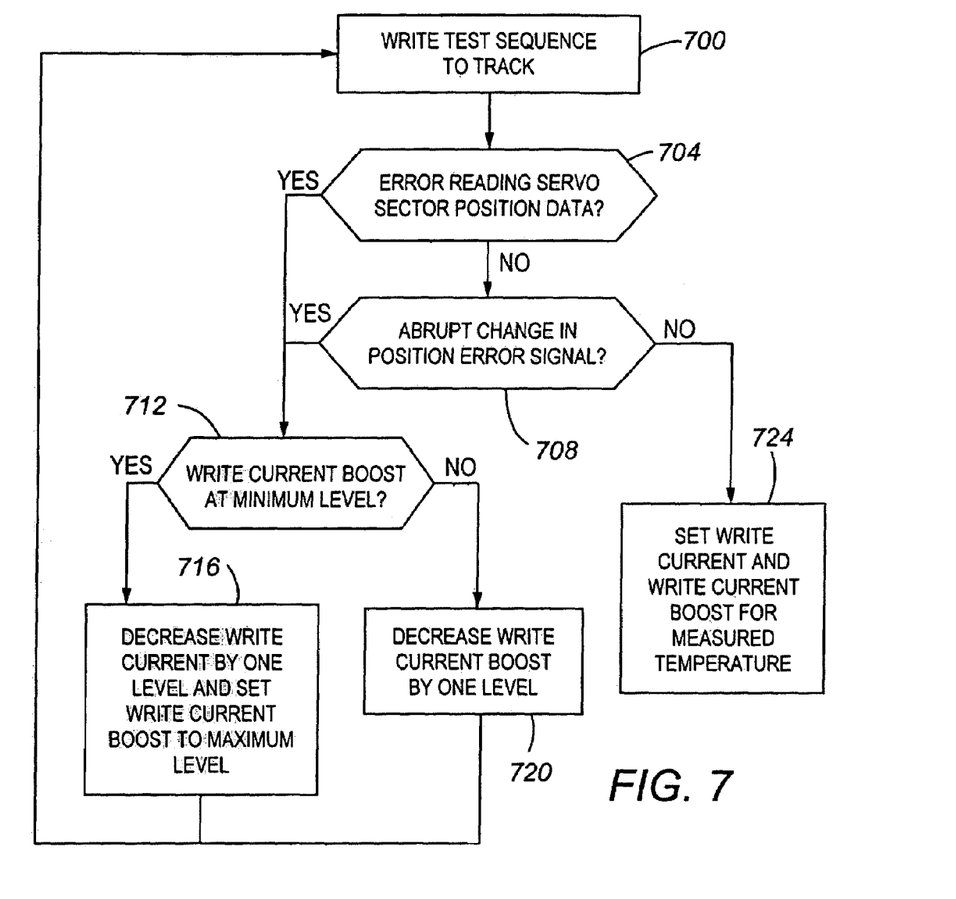
FIG. 7 is a flow chart of determining the write current based on servo information and position error in accordance with the present invention.

FIG. 7 is a flow chart of determining the write current and write current boost at the ambient temperature based on servo information and position error in accordance with the present invention. The flow chart begins where the previous flow chart left off. That is, the maximum write current and write current boost that achieve the specified bit error rate are reduced to avoid head instability and pole tip protrusion.

Initially, the head 204 writes a test sequence to a track 136 using the selected write current and write current boost (step 700). During the first iteration, the selected write current and write current boost are the maximum write current and write current boost that achieve the specified bit error rate, as determined in the previous flow chart. The test sequence is written to multiple data sectors in a relatively long segment of the track 136 to heat the transducer 124 as though writing large amounts of user data.

The head 204 then reads servo sector position data from the track 136 immediately following writing the test sequence to the track 136, and a determination is made as to whether there is an error in the read servo sector position data (step 704). An error in the read servo sector position data indicates the head 204 has write induced instability that causes the read element 308 to become insensitive to the servo sector position data. If write induced instability is present, then the gray code that encodes the servo sector position data in the servo sector following the data sector to which the test sequence is written will be unreadable.

If no error arises in reading the servo sector position data, then a determination is made as to whether there is an abrupt change in the position error signal based on the read servo sector position data (step 708). An abrupt change in the position error signal indicates that the transducer 124 has pole tip protrusion that causes an abrupt change in the position of the head 204.

Following the detection of an error reading the servo sector position data at step 704, or a sudden change in the position error signal at step 708, a determination is made as to whether the write current boost is the minimum level (step 712). If the write current boost is the minimum level, then the write current is decreased by one level and the write current boost is set to the maximum level (step 716). If the write current boost is not the minimum level, then the write current remains at its present level and the write current boost is decreased by one level (step 720). After step 716 or step 720 is performed, the process returns to step 700 and the head 204 writes the test sequence again to the track 136 using the decreased write current or write current boost during the next iteration.

If no error in reading the servo sector position data and no abrupt change in the position error signal is detected, then the write current and write current boost during the preceding iteration are validated and stored in a table as nominal write current and write current boost for the measured temperature (step 724).

Figure 8:
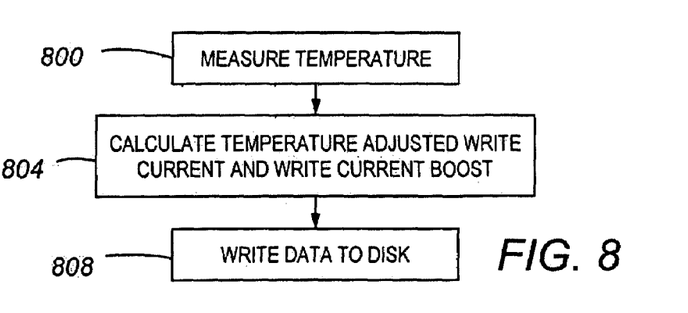
FIG. 8 is a flow chart of determining and updating the write current in accordance with the present invention.

FIG. 8 is a flow chart of determining and updating the write current in accordance with the present invention. The flow chart begins where the previous flow charts left off. That is, the previous flow charts are performed during optimization of the disk drive 100 prior to delivery to the end user, whereas the following flow chart is performed during normal operation of the disk drive 100 after delivery to the end user. For instance, the following flow chart can be performed every minute for the first 15 minutes after the disk drive 100 is powered up, and every five minutes thereafter.

Initially, the ambient temperature of the disk drive 100 is measured (step 800). Next, the temperature adjusted write current and write current boost are calculated and stored in a table (step 804). Thereafter, a write operation is performed using the calculated write current and write current boost retrieved from the table (step 808).

The disk drive 100 can determine the write current and write current boost for a variety of ambient temperatures. Furthermore, different algorithms can calculate the write current and write current boost for different temperature ranges. For instance, a first algorithm can adjust the write current and write current boost at temperatures greater than a selected temperature, and a second algorithm can adjust the write current and write current boost at temperatures below the selected temperature.

An algorithm for high ambient temperatures is as follows:

write current adjustment=5−(measured ambient temperature−27)/5

An algorithm for low ambient temperatures is as follows:

write current adjustment=−(measured ambient temperature−55)/11

The resulting write current adjustment is the number of digital to analog converter levels by which the write current is adjusted. Similar algorithms can be used for adjusting the write current boost. The algorithms can be implemented in firmware or microcode running on the controller 132, and the tables that store the write current and write current boost at various temperatures can be held in the controller 132.

The algorithms can be customized for each model or family of disk drives 100, for disk drives 100 within a family of disk drives 100 that use transducers 124 supplied by a different vendors, or for each individual disk drive 100.

The write current and write current boost can be calculated for each zone on the disk 108, for each head 204 in the disk drive 100, and for multiple ambient temperatures both above and below the normal operating temperatures of the disk drive 100. Likewise, the write current and write current boost can be adjusted during normal operation of the disk drive 100 if the measured ambient temperature falls outside a temperature range for the nominal write current and write current boost.

Pole tip protrusion can be detected by a sudden change in the position error signal, or alternatively, a sudden change in the mean square error of data that is written and read by the head 204.

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present invention. The embodiments herein are further intended to explain the best mode presently known of practicing the invention and to enable others skilled in the art to utilize the invention in such or in other embodiments and with various modifications required by their particular application or use of the invention. It is intended that the appended claims include alternative embodiments to the extent permitted by the prior art.

What is claimed is:

1. A method, comprising:
providing a disk drive having a disk and a head for writing data to reading data from the disk;
sensing a temperature of the disk drive;
determining a maximum write current which satisfies a predetermined bit error rate associated with writing data to the disk using the head; then
determining whether the maximum write current satisfies a write induced instability test associated with reading data from the disk using the head; and
if the maximum write current does not satisfy the write induced instability test, then reducing the maximum write current until the write induced instability test is satisfied.

2. The method of claim 1, wherein the write induced instability test includes:
writing a test sequence to multiple data sectors on the disk using the maximum write current and the head; and
reading servo sector position data from the disk using the head immediately after writing the test sequence.

3. The method of claim 2, wherein the write induced instability test is not satisfied if an error exists in reading the servo sector position data.

4. The method of claim 1, wherein if the maximum write current satisfies the write induced instability test, then
determining whether the maximum write current satisfies a pole tip protrusion test associated with the head; and
if the maximum write current does not satisfy the pole tip protrusion test, then reducing the maximum write current until the pole tip protrusion test is satisfied.

5. A method for providing temperature compensated write current in a disk drive, comprising:
measuring a temperature of the disk drive;
writing data to a first track of a disk using a head as a write current is supplied to the head;
writing data to second and third tracks adjacent to the first track as the write current is supplied to the head;
reading the data from the first track using the head;
determining a bit error rate for the data read from the first track using the head;
in response to the bit error rate within a predetermined bit error rate, increasing the write current and repeating the steps of writing data to the first, second and third tracks as the increased write current is supplied to the head;
in response to the bit error rate exceeding the predetermined bit error rate, decreasing the write current;

setting a nominal write current that does not result in the bit error rate exceeding the predetermined bit error rate; then writing data to track of the disk as the nominal write current is supplied to the head and;

in response to detecting at leas tone of an error reading servo sector position information from the track using the head and a position error signal indicating a change in position of the head relative to the track, decreasing the nominal write current.

6. The method of claim 5, further comprising decreasing the nominal write current in response to detecting the error.

7. The method of claim 6, wherein the error is due to write induced instability of the head.

8. The method of claim 5, further comprising decreasing the nominal write current in response to the position error signal indicating the change in position of the head.

9. The method of claim 5, wherein the change in position or the head is due to pole tip protrusion of the head.

10. The method of claim 5, further comprising:
  detecting the nominal write current in response to detecting the error due to write induced instability of the head; and
  decreasing the nominal write current in response to the position error signal indicating the change in position of the head due to pole tip protrusion of the head.

11. In a disk drive that includes a disk and a head that reads from and writes to the disk, wherein the head writes to the disk in response to a write current, a method of compensating the write current for a temperature of the disk drive, the method of comprising:
  measuring an ambient temperature of the disk drive;
  providing a first write current with acceptable bit error rate at the ambient temperature by adjusting an initial write current; and then
  providing a second write current with acceptable stability of the head at the ambient temperature by adjusting the first write current; and
  providing a third write current with acceptable pole tip protrusion of the head at the ambient temperature by adjusting the second write current.

12. The method of claim 11, including:
  reading servo information from the disk using the head;
  generating a position error signal in response to the read servo information;
  comparing the position error signal to a threshold; and
  changing the write current in response to the comparison.

13. The method of claim 12, including changing the write current in response to an abrupt change in the position error signal.

14. The method of claim 12, including decreasing the write current if the position error signal is greater than the threshold.

15. The method of claim 12, including decreasing the write current if the position error signal is greater than the threshold and then repeating the reading, the generating, the comparing and the changing for the decreased write current.

16. In a disk drive that includes a disk and a head that reads from and writes to the disk, wherein the head writes to the disk in response to a write current, a method of compensating the write current for a temperature of the disk drive, the method of comprising:
  measuring an ambient temperature of the disk drive using a temperature sensor in the disk drive;
  providing a first write current with acceptable bit error rate at the ambient temperature, starting with an initial write current, by:

(i) writing a first test sequence to the disk using the head;
  (ii) reading the first test sequence from the disk using the head;
  (iii) measuring a bit error rate of the read first test sequence;
  (iv) comparing the measured bit error rate to a threshold; and
  (v) changing the write current in response to the comparison; and then providing a second write current with acceptable stability of the head at the ambient temperature, starting with the first write current, by:
  (vi) writing a second test sequence to the disk using the head;
  (vii) reading servo information from the disk using the head immediately following writing the second test sequence; and
  (viii) decreasing the write current in response to an error in the read servo information.

17. The method of claim 16, including increasing the write current in step (v) if the measured bit error rate is less than the threshold.

18. The method of claim 16, including decreasing the write current in step (v) if the measured bit error rate is greater than the threshold.

19. The method of claim 16, including generating the error in step (viii) in response to failing to recover gray code in the servo information.

20. The method of claim 16, including providing a third write current with acceptable pole tip protrusion of the head at the ambient temperature, starting with the second write current, by:
  (ix) writing a third test sequence to the disk using the head;
  (x) reading servo information from the disk using the head immediately following writing the third test sequence;
  (xi) generating a position error signal in response to the read servo information; and
  (xii) decreasing the write current in response to an abrupt change in the position error signal.

21. The method of claim 20, including writing the second and third test sequences in steps (vi) and (ix) as the same test sequence on a track on the disk, and reading the servo information in steps (vii) and (x) from the track.

22. The method of claim 16, including providing the first write current as a maximum write current with acceptable bit error rate, and providing the second write current as a maximum write current with acceptable stability of the head.

23. The method of claim 16, including performing the method on a zone-by-zone basis for each zone on the disk.

24. The method of claim 16, including performing the method on a head-by-head basis for each head in the disk drive.

25. The method of claim 16, including performing the method on an ambient temperature by ambient temperature basis for multiple ambient temperatures of the disk drive above and below an ambient temperature range.

26. In a disk drive that includes a disk and a head that reads from and writes to the disk in response to a write current, a method of compensating the write current for a temperature of the disk drive, the method of comprising:
  measuring an ambient temperature of the disk drive using a temperature sensor in the disk drive;
  providing a first write current with acceptable bit error rate at the ambient temperature, starting with an initial write current, by:

(i) writing a first test sequence to the disk using the head;

(ii) reading the first test sequence from the disk using the head;

(iii) measuring a bit error rate of the read first test sequence;

(iv) comparing the measured bit error rate to a threshold; and (v) increasing the write current and repeating steps (i) through (v) if the measured bit error rate is less than the threshold, otherwise setting the first write current to the write current in step (i); and then providing a second write current with acceptable stability of the head at the ambient temperature starting with the first write current, by:

(vi) writing a second test sequence to the disk using the head;

(vii) reading servo information from the disk using the head immediately following writing the second test sequence; and (viii) decreasing the write current and repeating steps (vi) through (viii) in response to an error in the read servo information, otherwise setting the second write current to the write current in step (vi).

27. The method of claim 26, wherein increasing the write current in step (v) enables the head to sufficiently magnetize the disk during write operations.

28. The method of claim 26, wherein increasing the write current in step (v) enables the head to reliably encode data on the disk during write operations.

29. The method of claim 26, including generating the error in step (viii) in response to failing to recover gray code in the servo information.

30. The method of claim 26, including providing a third write current with acceptable pole tip protrusion of the head at the ambient temperature, starting with the second write current, by:

(ix) writing a third test sequence to the disk using the head;

(x) reading servo information from the disk using the head immediately following writing the third test sequence;

(xi) generating a position error signal in response to the read servo information; and (xii) decreasing the write current and repeating steps (ix) through (xii) in response to an abrupt change in the position error signal error, otherwise setting the third write current to the write current in step (ix).

31. The method of claim 30, including writing the second and third test sequences in steps (vi) and (ix) as the same test sequence on a track on the disk, and reading the servo information in steps (vii) and (x) from the track.

32. The method of claim 26, including providing the first write current as a maximum write current with acceptable bit error rate, and providing the second write current as a maximum write current with acceptable stability of the head.

33. The method of claim 26, including performing the method on a zone-by-zone basis for each zone on the disk.

34. The method of claim 26, including performing the method on a head-by-head basis for each head in the disk drive.

35. The method of claim 26, including performing the method on an ambient temperature by ambient temperature basis for multiple ambient temperatures of the disk drive above and below an ambient temperature range.

* * * * *